United States Patent
Oishi et al.

(10) Patent No.: US 6,590,774 B2
(45) Date of Patent: *Jul. 8, 2003

(54) IGNITION APPARATUS FOR INTERNAL COMBUSTION ENGINE WITH IMPROVED ELECTRICAL INSULATION PLATE INCLUDING BERYLLIA

(75) Inventors: Hidetoshi Oishi, Hitachinaka (JP); Noboru Sugiura, Mito (JP); Kenichi Katagishi, Hitachinaka (JP)

(73) Assignees: Hitachi, Ltd., Tokyo (JP); Hitachi Automotive Engineering Co., Ltd., Ibaraki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/437,662

(22) Filed: Nov. 10, 1999

(65) Prior Publication Data

US 2002/0012230 A1 Jan. 31, 2002

Related U.S. Application Data

(63) Continuation of application No. 08/979,541, filed on Nov. 26, 1997, now abandoned, which is a continuation of application No. 08/778,774, filed on Jan. 6, 1997, now abandoned, which is a continuation of application No. 08/619,921, filed on Mar. 20, 1996, now abandoned, which is a continuation of application No. 08/362,875, filed on Dec. 23, 1994, now abandoned.

(30) Foreign Application Priority Data

Dec. 27, 1993 (JP) ............................................. 5-331048

(51) Int. Cl.$^7$ ................................................. H05K 7/20
(52) U.S. Cl. ........................ 361/707; 228/121; 257/719; 257/748
(58) Field of Search ............................... 123/41.31, 647; 361/704, 707, 710, 714, 715, 730, 717–719; 228/121; 257/707, 717, 748, 779, 783

(56) References Cited

U.S. PATENT DOCUMENTS

| | | |
|---|---|---|
| 3,492,545 A | 1/1970 | Meyerhoff |
| 4,034,468 A | 7/1977 | Koopman |
| 4,047,242 A | 9/1977 | Jakob et al. |
| 4,278,990 A | 7/1981 | Fichot |
| 4,470,063 A | 9/1984 | Arakawa et al. |
| 4,554,575 A * | 11/1985 | Lucas |
| 4,557,225 A | 12/1985 | Sagues et al. |
| 4,677,741 A | 7/1987 | Takahama |
| 5,075,965 A | 12/1991 | Carey et al. |
| 5,159,532 A | 10/1992 | Kilian et al. |
| 5,182,628 A | 1/1993 | Izawa et al. |
| 5,272,375 A | 12/1993 | Belopolsky |
| 5,453,582 A * | 9/1995 | Amano |
| 5,467,758 A * | 11/1995 | Moriyama |
| 5,606,487 A | 2/1997 | Yasukawa et al. |

FOREIGN PATENT DOCUMENTS

JP 0330440 of 1991

* cited by examiner

*Primary Examiner*—Gerald Tolin
(74) *Attorney, Agent, or Firm*—Antonelli, Terry, Stout & Kraus LLP (57) ABSTRACT

An ignition apparatus is provided for internal combustion engines to obtain higher reliability for the solder bonding parts. The ignition apparatus includes a molded case having an input-output terminal formed on the molded case, a semiconductor switching device, a control circuit board, and a heat sink. As such, the molded case provides a single body for containing the input-output terminal, the semiconductor switching device, the control circuit board and the heat sink. On the heat sink, one or more laminated structures are used, including the semiconductor switching devices with beryllia as an electric insulation plate.

4 Claims, 7 Drawing Sheets

IGNITION APPARATUS FOR INTERNAL COMBUSTION ENGINE WITH IMPROVED ELECTRICAL INSULATION PLATE INCLUDING BERYLLIA

CROSS-REFERENCE TO RELATED APPLICATIONS

This application is a continuation of application Ser. No. 08/979,541 filed on Nov. 26, 1997, now abandoned, which is a continuation of application Ser. No. 08/778,774 filed on Jan. 6, 1997, now abandoned, which is a continuation of application Ser. No. 08/619,921 filed on Mar. 20, 1996, now abandoned which is a continuation of application Ser. No. 08/362,875 filed on Dec. 23, 1994, now abandoned the entire disclosures of which are hereby incorporated.

BACKGROUND OF THE INVENTION

1. Field of the Invention

The present invention relates to an electronic apparatus used for the internal combustion engine, specifically, to a laminated structure in the semiconductor switching devices.

2. Description of the Prior Art

In the prior art, Beryllia is used for reducing the heat generation from the power transistors in order to reduce the heat resistance, in which the life-time elongation technology for the laminated structure is not used and, in some cases, there is no consideration for the long-time guarantee to be required for the automotive parts.

For example, one of this kind of electronic apparatus is described in the Japanese Patent Application Laid-Open No. 3-30440(1991).

SUMMARY OF THE INVENTION

In the prior art apparatus, in order to release efficiently the heat generated by the semiconductor switching device, Beryllia is selected for the material used for the electric insulation plate. In these devices, a refractory metal is used for the solder as the bonding between the beryllia and the metallic heat sink, and the bonding between the semiconductor switching devices. In case that the atmospheric conditional change and the repetitive stress due to the self heat generation occur, the stress is applied to the solder bonding parts, and the crack arises in the solder bonding parts, and consequently, there might be the catastrophic breakdown in the solder bonding parts. And furthermore, in the prior art, the laminated structure is formed in a single module, and the dispersion in the structural and material property of the solder bonding parts could be made to be as small as possible. However, in case that a plurality of laminated layers are formed in a single module, what makes problems is that the dispersion in the manufacturing quality of the solder bonding parts may become greater and the fraction of the defective parts may increase.

The object of the present invention is to provide an ignition apparatus for the inner combustion engine with high reliability in its device bonding parts.

In the present invention, the material is selected so as to be used for the solders for bonding the semiconductor switching device and the beryllia, and for bonding the beryllia and the metallic heat sink. In general, as there may be a case that the temperature due to the heat generation by the switching devices reaches as high as 100° C. to 350° C., refractory metal is used as the solder. The solder having lower melting point is used generally for the bonding under the beryllia so that the difference α in the thermal expansion coefficient between the metallic heat sink and the beryllia may be compensated. In case that the difference α is already within 0.000001/° C., general purpose standard solder materials are used for the bonding. In case that the difference α is over 0.000001/° C., nonstandard long-life solder materials are used. By keeping the thickness of the solder bonding layer between the heat sinks and between the switching devices, respectively, greater than from t0.05 mm to t0.2 mm, it can be respected that the dispersion in the manufacturing process and the fraction of the defected parts may be reduced.

In controlling the component and the thickness of the solder materials, for example, as for solder including refractory metal, what may be used includes solder with Pb:Sn=90:10, solder with Pb:Sn=80:20, solder including antinomies metal, and solder including Ag. As for solder with lower melting point, what can be used includes solder including eutectic materials, and solder with Pb:Sn=50:50. In addition, for the lifetime elongation of the solder bondings, the thickness control is used. For example, refractory metal is used for the solder bonding under the switching device, and solder including eutectic materials or high-temperature solder can be used for the solder bonding under the beryllia. In case of using FE for the metallic heat sink, the lifetime elongation can be established without serious control of the thickness of the solder bondings, because of the lower difference α in the thermal expansion coefficient. In case of using Cu or Al for the metallic heat sink, it is required to control seriously the thickness of the solder bondings. In case of using solder materials with Pb:Sn=90:10 for the solder materials under the switching devices, in general, it will be appreciated that the thickness of the solder bonding to be kept over 0.05 mm can contribute to the elongation of the lifetime.

DETAILED DESCRIPTION OF THE PREFERRED EMBODIMENTS

Figure 1:
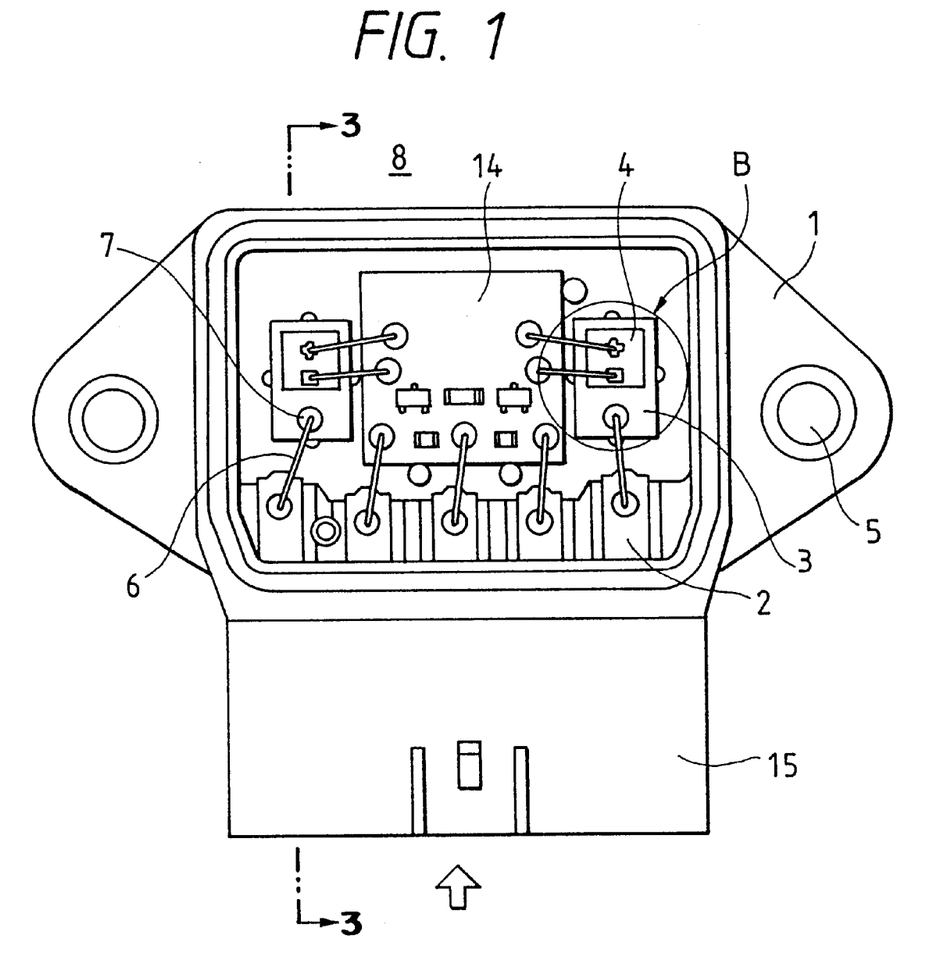
FIG. 1 is a schematic view showing an embodiment of the present invention.
Figure 2:
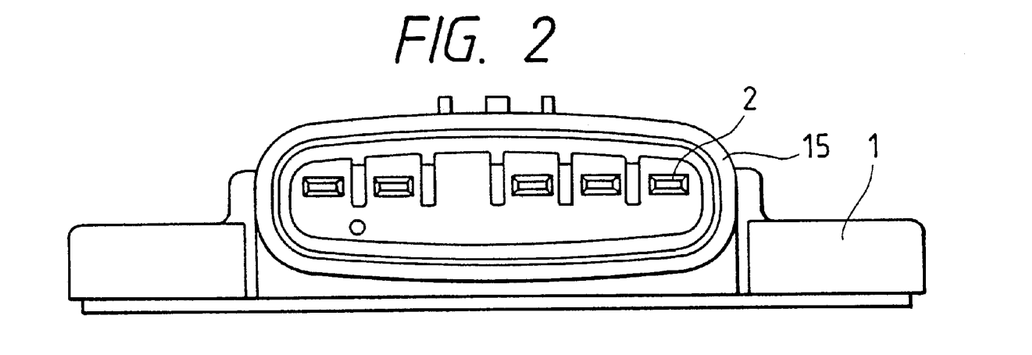
FIG. 2 is a side view from the direction of an arrow of FIG. 1.
Figure 3:
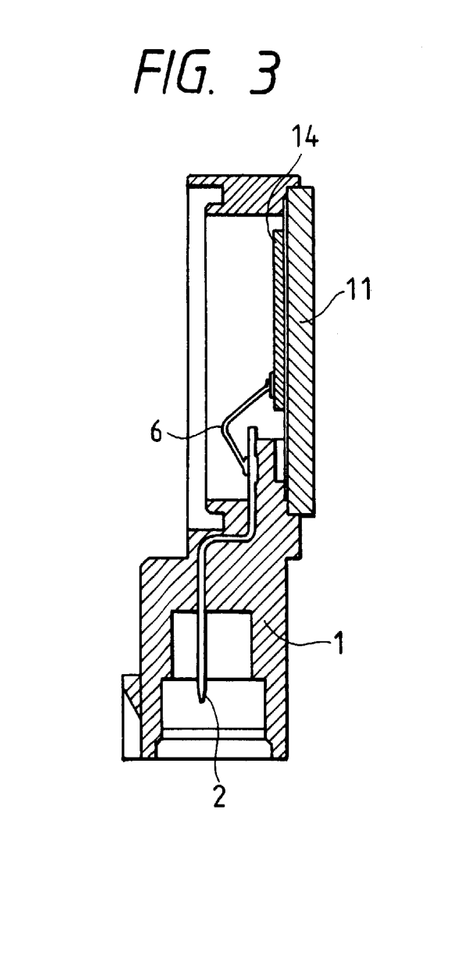
FIG. 3 is a sectional view taken along the line A–A' of FIG. 1.
Figure 4:
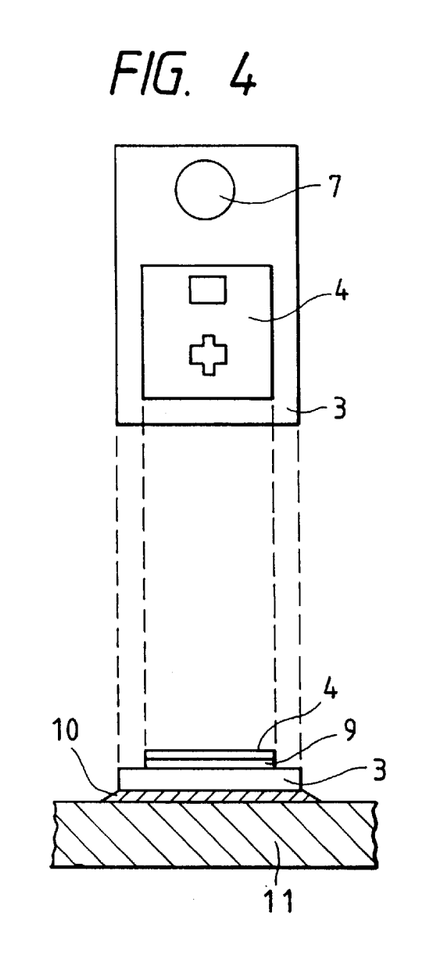
FIG. 4 is an enlarged view of the part B of FIG. 1.
Figure 5:
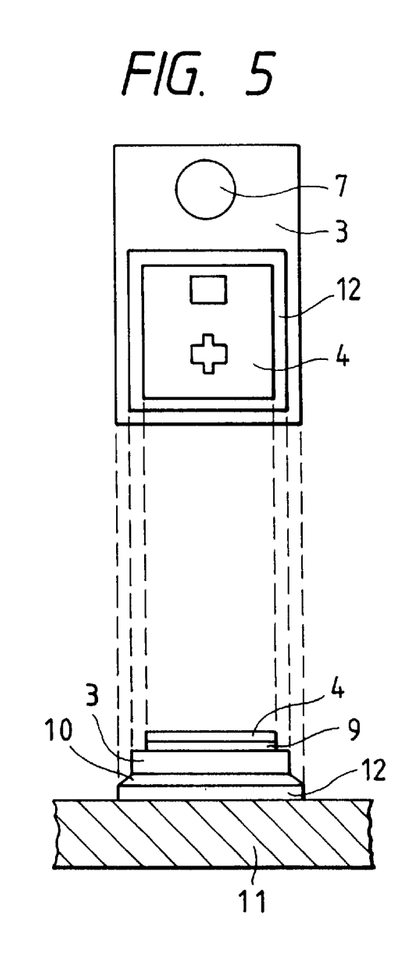
FIG. 5 is a view similar to FIG. 4, showing another example of the part B.
Figure 6:
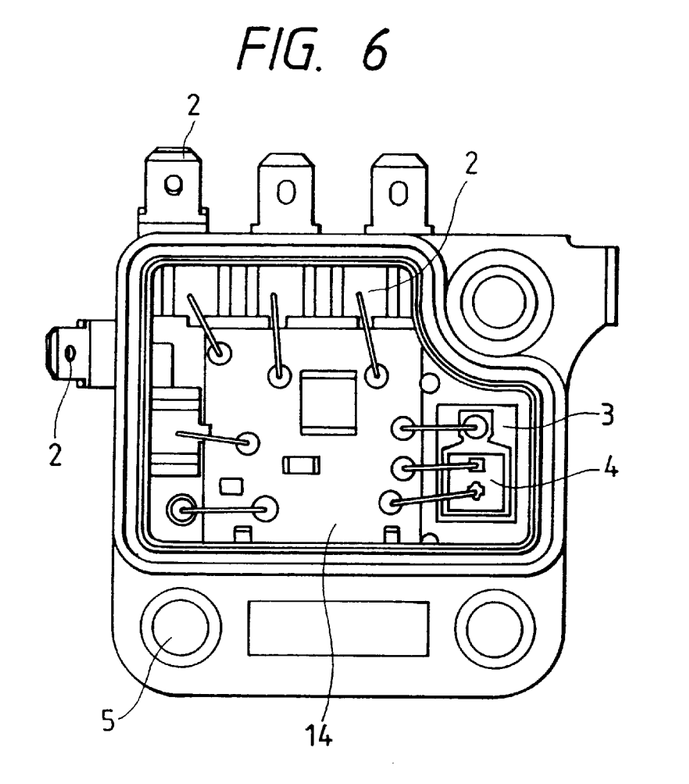
FIG. 6 is schematic view showing another embodiment of the present invention.
Figure 7:
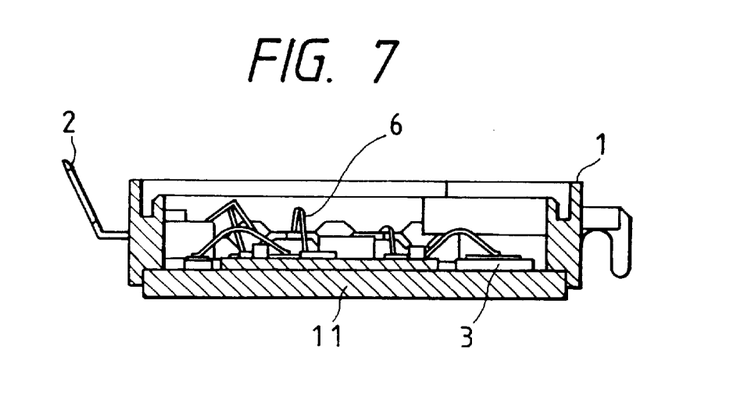
FIG. 7 is a side view showing an inside of the apparatus of FIG. 6.
Figure 8:
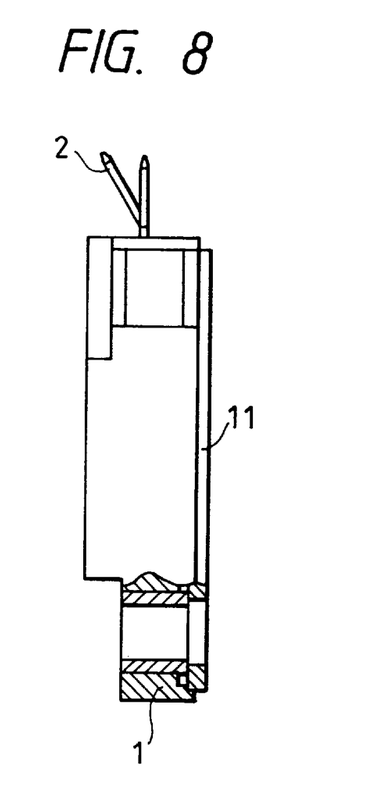
FIG. 8 is a side view of the apparatus shown in FIG. 6.
Figures 9, 10, 11, 12:
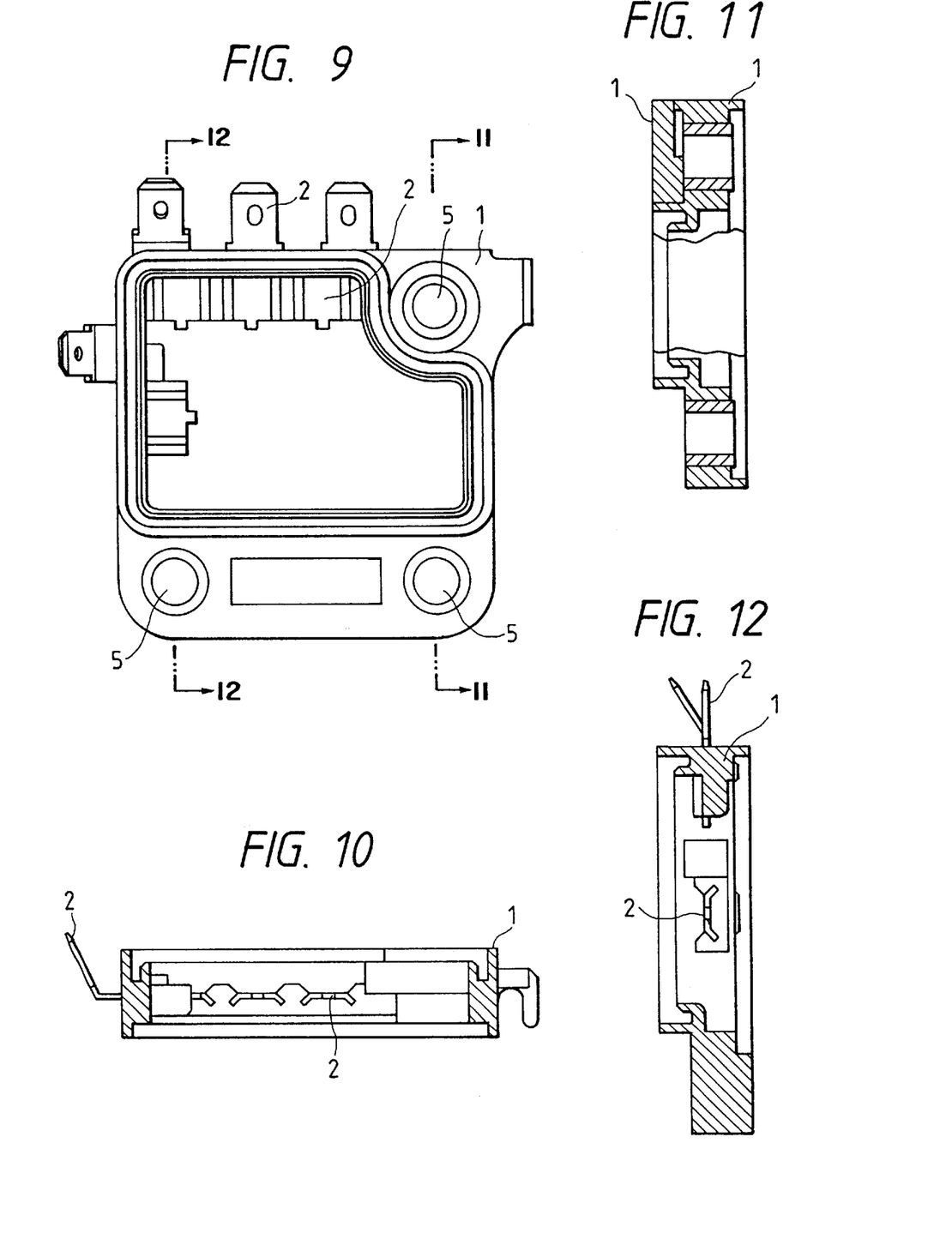
FIG. 9 is a view showing a mold case and a connector.
FIG. 10 is a side view showing an inside of the apparatus of FIG. 9.
FIG. 11 is a sectional view taken along the line C–C' of FIG. 9.
FIG. 12 is a sectional view taken along the line B–B' of FIG. 9.
Figure 13A:
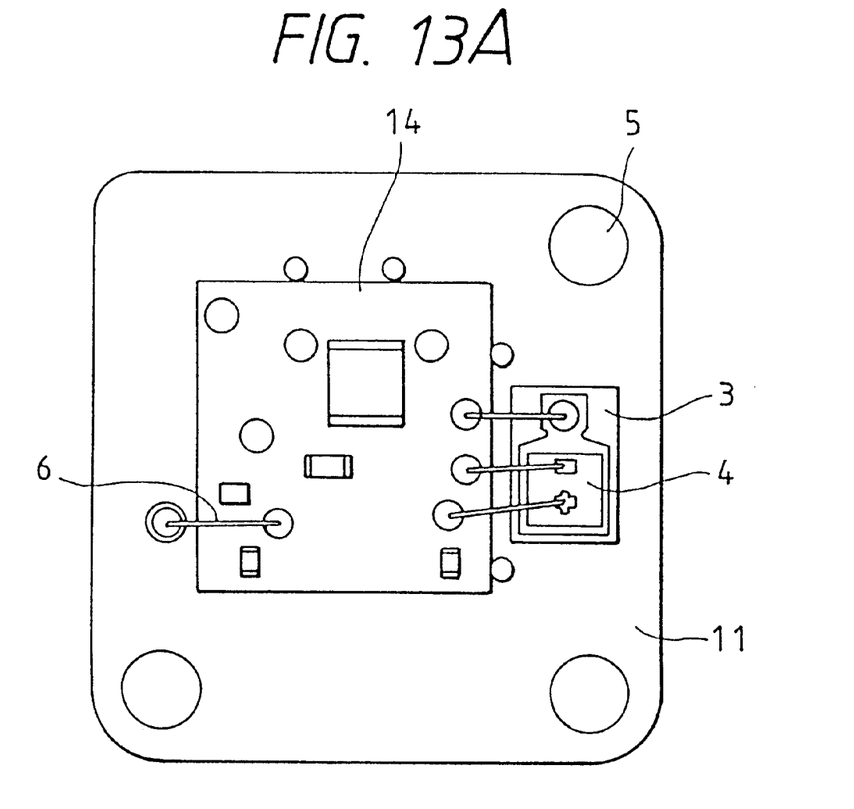
FIG. 13 is a side view showing inside parts of the apparatus of FIG. 9.
Figure 13B:
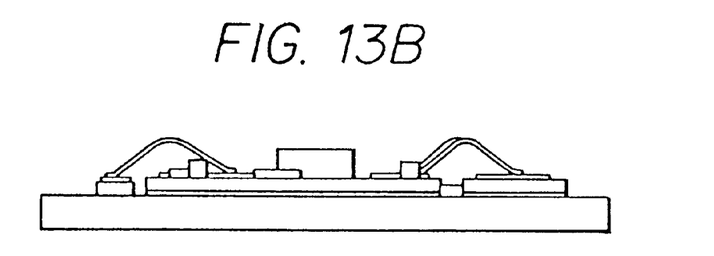

An embodiment of the present invention will be described hereinafter. A module shown in FIG. 1 is an embodiment of the ignitor module 8 for the direct ignition system, which will be designated "DIS ignitor" below, using a laminated body (as shown in FIGS. 2 and 3) composed of the semiconductor switching devices 4 which can be formed of Darlington-type power transistors or MOS-FET type transistors, for example. FIG. 2 is a side view from the direction of an arrow shown at the bottom of FIG. 1, and FIG. 3 is a sectional view taken along the line A–A' of FIG. 1. This ignition apparatus is a DIS ignitor module of simultaneous ignition type for 4-cylinder automobile engines or 8-cylinder automobile engines. In the action of the DIS ignitor module, by switching the current to be put into the primary circuit of the ignition coil by controlling the signal from the engine control unit which leads to the high-voltage induced in the primary circuit of the ignition coil to be connected to the ignition plug, electric sparks are generated in the engine cylinder. The DIS ignitor module 8 is used for controlling the signal from the control unit. The control circuit board 14 and the switching devices 4, for example, power transistors, are connected by electrically conductive wires composed of metal such as aluminum, nickel, steel, nickel ferrite, copper alloys, linking between the input-output terminals 2 and connectors 15, both formed in a single molded body, and thus, are driven. In this driving operation, the electric current flowing in the power transistor 4 is from 0A to 15A, which generates heat in the transistor. The amount of heat generated here is subject to the switching pattern of the electric power by the engine control unit and the characteristic of the ignition coil, and generally, the range of the electric power is 0 to 150 W, and the temperature rise in the power transistors in a very short time period is from 100° C. to 350° C. when consuming the maximum electric power. In case of using power transistors for the switching devices 4, it is required to remove heat generated in the devices efficiently so as to control the temperature below 150° C. It is concluded that a laminated structure should be used as shown in FIGS. 4 and 5. In the laminated body as shown in FIGS. 4 or 5, the power transistor 4 at the top, the electric insulator 3 composed of beryllia (BeO) in the middle, and the heat sink 11 composed of aluminum at the bottom are bonded by solder layers 9 and 10. The component of the solder 9 below the power transistor 4 may be refractory metal, for example, Pb:Sn:Ag=93.5:5:1.5, Pb:Sn=90:10, and Pb:Sn=80:20, or an alloy containing antimony pertinently. For the solder 10, solder material with a low-temperature melting point or a solder identical to the solder 9 may be used. For example, the component of the solder 10 may be amorphous solder, Pb:Sn=50:50, solder containing Sn, and solder containing Ag. In addition, in the embodiment shown in FIG. 5, by inserting a copper plate 12 as a supplemental heat sink below the solder 10, the heat generated in the power transistor can be removed efficiently. In the configuration shown in FIG. 5, the bonding between the copper plate and the heat sink 11 can be established by soft soldering, soldering, ultra-sonic melting. And furthermore, the material used for the heat sink may be selected to be copper or steel, and especially when using a steel plate for the heat sink, the damage due to the heat cycle fatigue tends not to be applied to the bonding part between the copper plate 12 and the heat sink 11 in FIG. 3 and the solder 10 in FIG. 2, and therefore, the laminated structure can be most easily established the manufacturing process. In more detail, as α of iron is $(7-8) \times 0.000001/°$ C. and α of beryllia 3 is $(11-12) \times 0.000001/°$ C., and thus the difference between α's is small, the thermal stress is applied less between these layers. When using iron as the material for the heat sink 11, the standard type of solder can be used. In contrast, when using other materials for the heat sink 11, the thickness of the solder layer and its components should be selected adequately for the target life time of the overall component. In the configuration shown in FIG. 5, it is optimal to use the same type of solder material for both of the solder layers 9 and 10 in view of considering the manufacturing process. This is brought by the advantage that the power transistor 4 and the supplemental heat sink formed by the copper plate 12 can be bonded simultaneously onto the beryllia 3 by applying an identical soldering process with distinctive solder materials, that is, solder 9 and 10, respectively, which contain a similar kind of materials and a similar melting point. In practical cases, it is necessary to choose solder materials in response to the materials used for the copper plate 12 as a supplemental heat sink and the heat sink 11, and to the bonding method. FIGS. 6, 7 and 8 show an embodiment of using a single unit of the laminated body shown in FIGS. 4 and 5. FIG. 6 is a model in which the mold case 1 and the heat sink 11 are connected. With the device formed in the configuration in FIG. 4 having a similar function to the DIS ignitor module 8, the ignitor module 13 covers the overall cylinders of the engine, in contrast to the configurations shown in FIGS. 4 and 5 where a laminated body is used for driving a ignition device at the individual cylinder, respectively, or for driving a couple of ignition devices at a couple of cylinders. In the manufacturing process of the part, the heat sink of FIG. 13 on which individual devices are mounted and connected to one another is covered by the mold case 1 and bonded to each other. FIGS. 11 and 12 is a side view of the assembled body of the heat sink and the mold case. The mount hole 5 is formed as a penetration hole, in which generally a cylindrical metallic collar or bush is inserted, through which the screws, generally M4, M5 or M6, are inserted in order to bind the modules 8 and 13. The electrically conductive wire 6 is used for connecting electrically the inside devices, for example the input-output terminals 2, and the laminated body. In case that the beryllia 3 and the wire can not be connected directly, the extended metallic pad 7 is used for connection. The metallic pad 7 is usually bonded by solder. The materials used for the electrically conductive wires may be aluminum, nickel and others.

As the heat resistance in the configuration in FIGS. 4 and 5 is about between 0.5 and 2.5° C./W, the advantage of using Beryllia is great. The temperature rise can be reduced by reducing the heat resistance at most 92% because the heat resistance is ordinarily between 1.5 and 6° C./W. In addition, the long-life durability can be attained by adjusting the thickness of the solder layers 9 and 10 so as to be over 0.05 mm to 0.25 mm.

Figure 14:
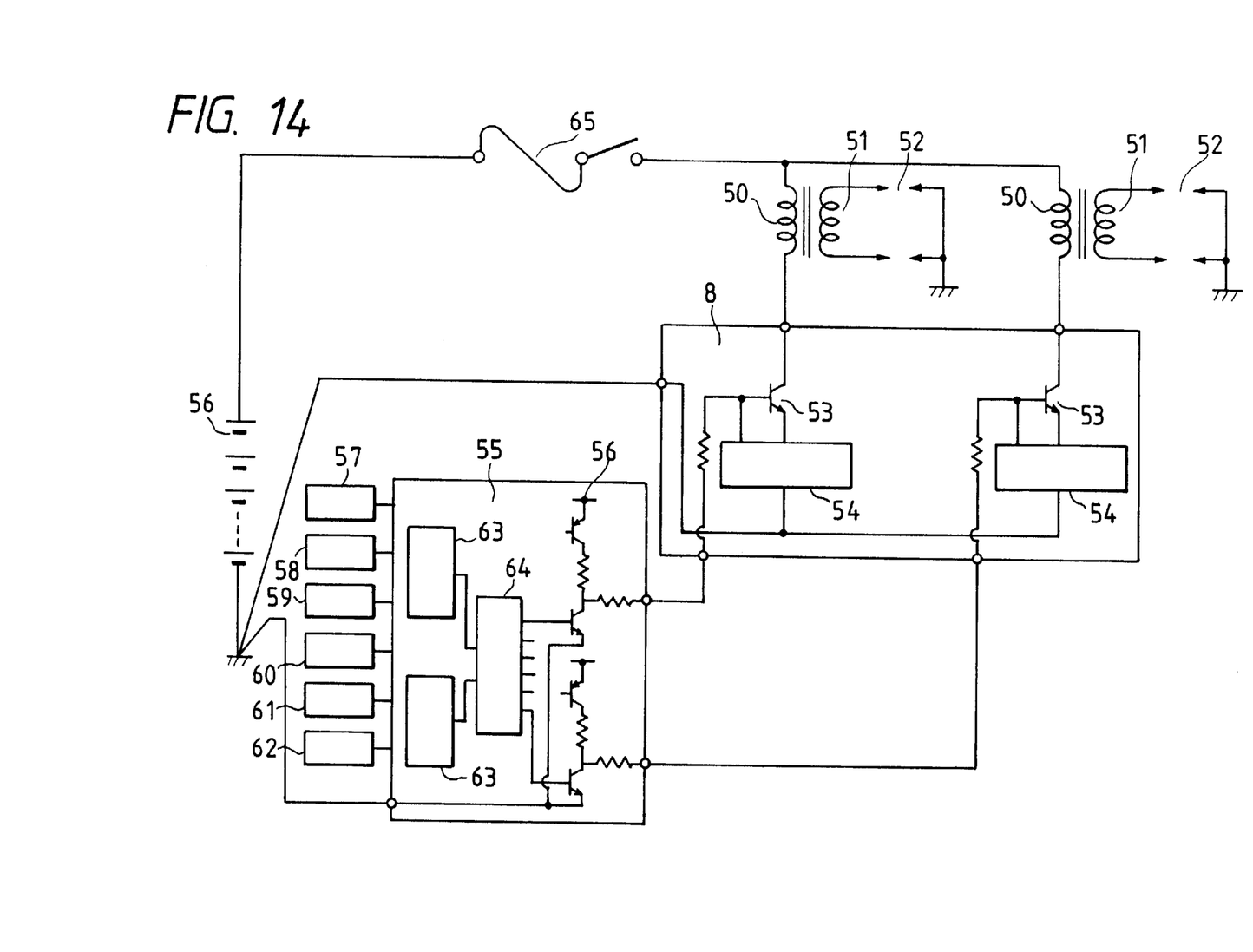
FIG. 14 is a block diagram showing an electronic distribution type ignition system to which the present invention is applied.

Referring to FIG. 14, an ignition system will be explained hereinafter. the ignition system 14 switches on or switches off a power transistor associated with each of engine cylinders, controls a current flowed through a primary coil 50 of an ignition coil, causes a secondary coil 51 of the ignition coil to generate a high voltage at an optimal timing and ignites an ignition plug 52. an ignition signal controlled to have a suitable current-carrying time indicative of a engine cylinder to be ignited, ignition position and so on, for switching on or off the power transistor, is supplied from a current-carrying time controller 64 through an ignition controller 63 in engine control unit 55. The ignition signal is generated on the basis of signals indicative of the state of operation of engine after closing a key switch 65 connected to a battery 56, which are supplied from a crank angle sensor 57, air flow sensor 58, water temperature sensor 59, an idle sensor 60, a knock sensor 61, an $O_2$ sensor 62 and so on.

Figure 15:
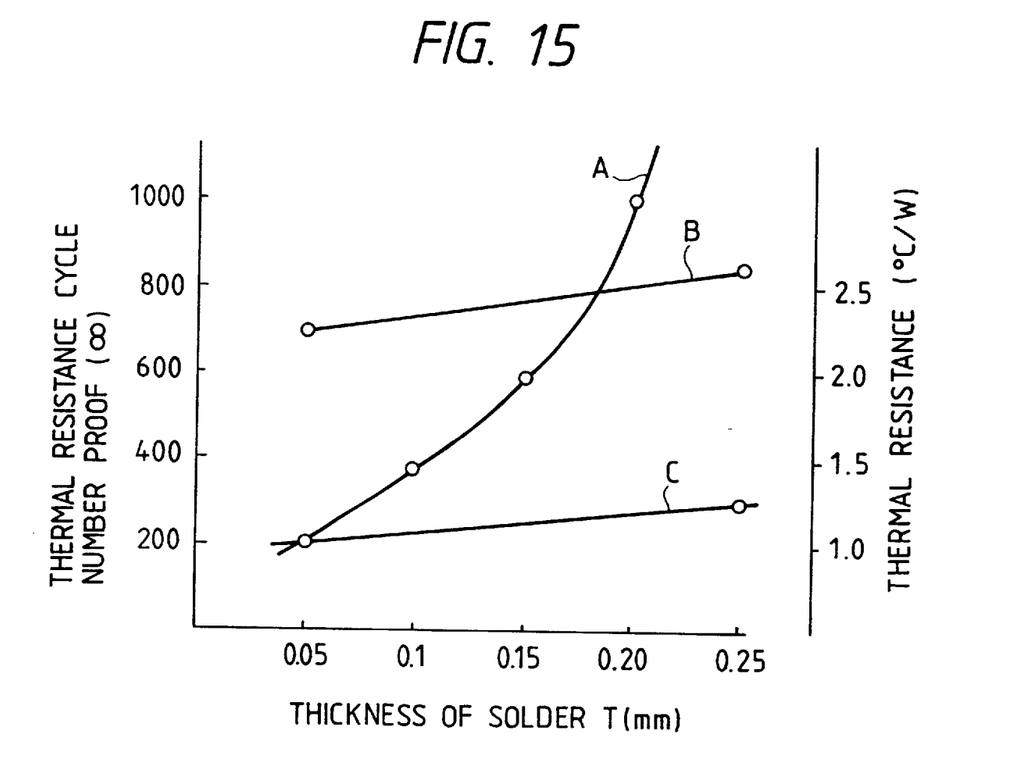
FIG. 15 is a characteristic diagram of the present invention.

Next, referring to FIG. 15, it will be explained the effect of the present invention. Since $\alpha$ of BeO is nearly equal to that of $Al_2O_3$, both life times due to thermal stress are nearly equal if the thickness and the material of solder are identical with each other. Therefore, heat resistance decreases, thus the temperature rise in the tip of the power transistor is remarkably suppressed. Since BeO is a material with high heat conductance, it is possible effectively to transfer heat. Assuming that heat generation of the tip is 50 watts(W) when the thermal resistance decreases from 2° C./W, to 1° C./W, the temperature differences between a tip and a heat sink may decrease from 50(W)×2° C./W=100° C. to 50(W)× 1° C./W=50° C. Accordingly, it is possible to equip the tip at a position where the temperature is higher. Further, Since the thermal stress between the tip and the heat sink can be decreased, the life time of solder bonding parts remarkably becomes long. Furthermore, the heat generation of the power transistor can be remarkably suppressed due to the decrease from B to C of the thermal resistance, thus the life time becoming longer.

What is claimed is:

1. An ignition apparatus for an internal combustion engine comprising a single body molded case having an input-output terminal in said molded case, and a semiconductor switching device provided in said molded case and mounted via an electric insulation plate on a heat sink, said molded case providing a single body containing said input-output terminal, said semiconductor switching device, said electric insulation plate and said heat sink, wherein said electric insulation plate comprises beryllia, and wherein there are provided a first solder bonding between said semiconductor switching device and said electric insulation plate, and a second solder bonding between said electric insulation plate and said heat sink, and further wherein the thickness of said first solder and said second solder, respectively, falls within 0.05 mm to 0.2 mm.

2. An ignition apparatus according to claim 1, wherein the melting point of said first solder is higher than that of said second solder.

3. An ignition apparatus according to claim 1, wherein said first solder is a solder with Pb:Sn=90:10, the thickness of which is more than 0.05 mm.

4. An ignition apparatus according to claim 1, wherein said input-output terminal is electrically connected through a metallic pad to said semiconductor switching device placed on said electric insulation plate.

* * * * *